United States Patent [19]

Faure et al.

[11] Patent Number: 5,319,240
[45] Date of Patent: Jun. 7, 1994

[54] THREE DIMENSIONAL INTEGRATED DEVICE AND CIRCUIT STRUCTURES

[75] Inventors: Thomas B. Faure, Georgia, Vt.; Bernard S. Meyerson, Yorktown Heights, N.Y.; Wilbur D. Pricer, Burlington, Vt.; Cecilia C. Smolinski, Jericho, Vt.

[73] Assignee: International Business Machines Corporation, Armonk, N.Y.

[21] Appl. No.: 12,812

[22] Filed: Feb. 3, 1993

[51] Int. Cl.$^5$ .................. H01L 29/06; H01L 29/00; H01L 29/40
[52] U.S. Cl. .................. 257/622; 257/618; 257/623; 257/760; 257/510
[58] Field of Search ............... 257/120, 110, 618, 622, 257/623, 615, 760, 510

[56] References Cited

U.S. PATENT DOCUMENTS

| | | | |
|---|---|---|---|
| 3,982,267 | 9/1976 | Henry | 257/656 |
| 3,988,760 | 10/1976 | Cline et al. | 257/120 |
| 4,091,406 | 5/1978 | Lewis | 257/760 |
| 4,255,207 | 3/1981 | Nicolay et al. | 257/510 |
| 4,717,681 | 1/1988 | Curran | 257/760 |

*Primary Examiner*—Rolf Hille
*Assistant Examiner*—Wael Fahmy
*Attorney, Agent, or Firm*—Whitham & Marhoefer

[57] ABSTRACT

A set of three-dimensional structures and devices may be wired together to perform a wide variety of circuit functions such as SRAMs, DRAMs, ROMs and PLAs. Both N-Channel and P-Channel transistors can be made. The P-channel devices are fabricated conventionally in separate N-wells or, alternatively, they are constructed in a like manner to the array N-channel devices. N and P diffused wire can be electrically joined at polysilicon contacts.

7 Claims, 13 Drawing Sheets

THREE DIMENSIONAL INTEGRATED DEVICE AND CIRCUIT STRUCTURES

BACKGROUND OF THE INVENTION

1. Field of the Invention

The present invention generally relates to semiconductor devices, methods for their fabrication and, more particularly, to three-dimensional semiconductor device structures and methods of providing sub-micron device structures.

2. Description of the Prior Art

The technology of producing semiconductor devices having greater and greater densities has advanced to the sub-micron realm of structural dimensions and is now approaching physical limits in the nanometer (nm) feature size range. In the foreseeable future, absolute atomic physical limits will be reached in the conventional two-dimensional approach to semiconductor device design used to produce Very Large Scale Integrated (VLSI) circuits. Traditionally, Dynamic Random Access Memory (DRAM) designers have faced the severest of challenges in advancing the technology. For example, designers of 64K DRAMs were confronted with the fact that a practical physical limit to charge capacity of storage capacitors had already been reached due to the minimum charge necessary to sense signals in the presence of environmental particulate radiation inherently present in fabrication materials. Storage capacitors in the range of 50 femto Farads (fF or $10^{-15}$ Farads) are now considered to be a physical limit. From a practical view, this limitation prevented the scaling of DRAM capacitors. Reduction of the surface area of a semiconductor substrate utilized by the storage capacitor has been severely restricted. Due to decreases in the thickness of capacitor materials, existing one Megabit (1 Mb) DRAM technologies continue to enjoy a freedom of planar device in circuit design. However, beginning with 4 Mb DRAMs the world of three-dimensional design has been explored to the extent that the simple single device/capacitor memory cell has been altered to provide the capacitor in the vertical dimension. In such designs, the capacitor has been formed in a trench in the surface of the semiconductor substrate. In yet denser designs, other forms of capacitor designs are proposed, such as stacking the capacitor above the transfer device. Additional designs have been proposed in which the device and its associated capacitor are formed within a trench of preferably minimum dimension.

While such design approaches appear to allow progressive increases in density in the near future, they are constrained by the limit of one memory cell per minimum photolithographic dimension. If semiconductor technology is to be extendable, design and process techniques are required which will enable true three-dimensional circuit design in which structural features are measured in nm and multiple circuit features are provided in the vertical dimension.

SUMMARY OF THE INVENTION

It is therefore an object of the present invention to provide methods for fabricating semiconductor device structures having dimensions determined by deposition techniques and enabling true three-dimensional structures.

It is another object of the invention to provide unique three-dimensional semiconductor structures which dramatically increase the densities achievable in VLSI circuits.

According to the invention, there is provided a set of three-dimensional structures and devices which may be wired together to perform a wide variety of circuit functions. The invention is particularly well adapted for the manufacture of array structures such as Static Random Access Memories (SRAMs), Dynamic Random Access Memories (DRAMs), Read Only Memories (ROMs) and Programmable Logic Arrays (PLAs); however, the invention may be applied to any integrated circuit structure where it is desired to achieve a high density component count. Both N-Channel and P-Channel transistors can be made. The support transistors may be simple ganged stacks of the array devices. The P-channel devices are fabricated conventionally in separate N-wells or, alternatively, they are constructed in a like manner to the array N-channel devices. N and P diffused wire can be electrically joined at polysilicon contacts.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

An Example of a Three-Dimensional Structure

Figure 1A:
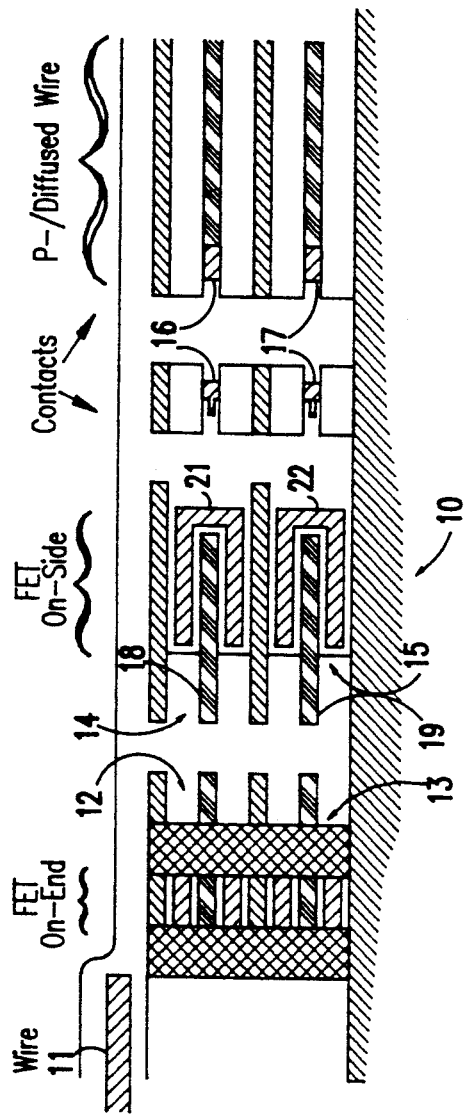
FIGS. 1A and 1B are cross-sectional views of two similar three-dimensional integrated circuit structures according to the invention.
Figure 1B:
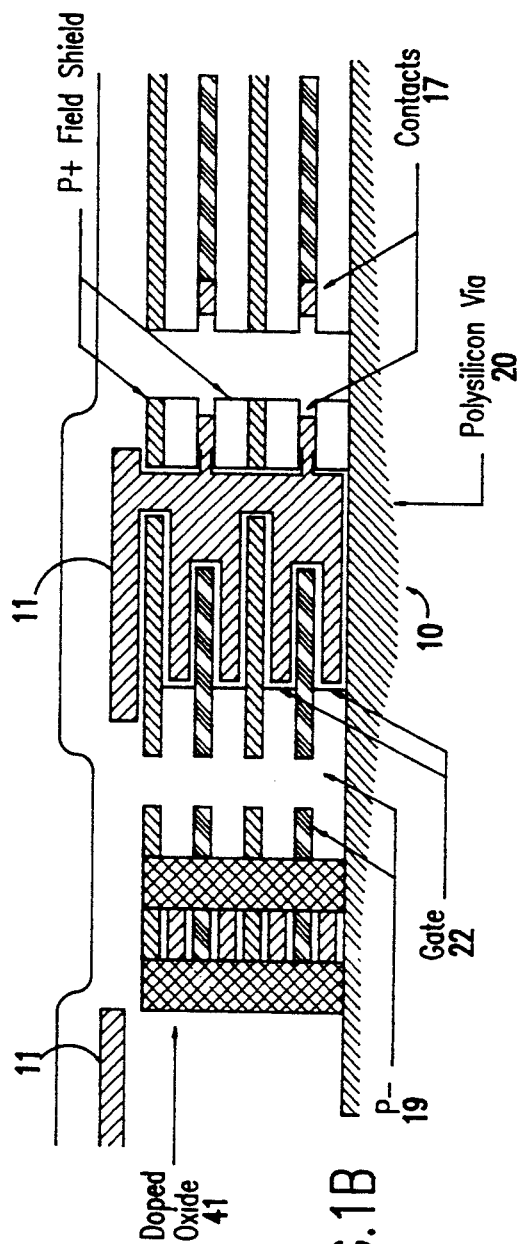

Referring now to the drawings wherein like reference numerals represent the same or similar elements, and more particularly to FIGS. 1A and 1B, there are shown two cross-sections through an integrated circuit with two stacked circuit levels. In principle, the stack could be extended to ten or a hundred circuit levels.

With reference first to FIG. 1A, the integrated circuit is formed on a substantially planar substrate 10 including a surface having an orientation parallel to a first plane. Formed on this surface are a plurality of Field Effect Transistor (FET) devices in three-dimensions. Scanning from left to right, there is a surface layer of polysilicon wire 11, two N-channel transistors 12 and 13 seen on-end, two N-channel transistors 14 and 15 seen on-side, polysilicon diffusion contacts 16 and 17, and two layers 18 and 19 of P-silicon suitable for forming transistor channels or diffused wiring. The P-layers 18 and 19 form the channels between the source and drain regions of the FETs, and these regions are interposed between polysilicon gates 21 and 22, for example. These channel regions are very thin and surrounded top and bottom by the controlling silicon gates.

FIG. 1B is similar to FIG. 1A but shows the two transistors 14 and 15 seen on-side with their polysilicon gates 21 and 22 wired together through a polysilicon via 20 to a surface level of the polysilicon wiring 11. In FIG. 1A, these same two transistors 14 and 15 are electrically isolated. Notice the gate material appears both above and below the channel material. This has the effect of shielding the channel from a back gate or from the electrical activity of adjacent circuits within the stack.

Figure 2:
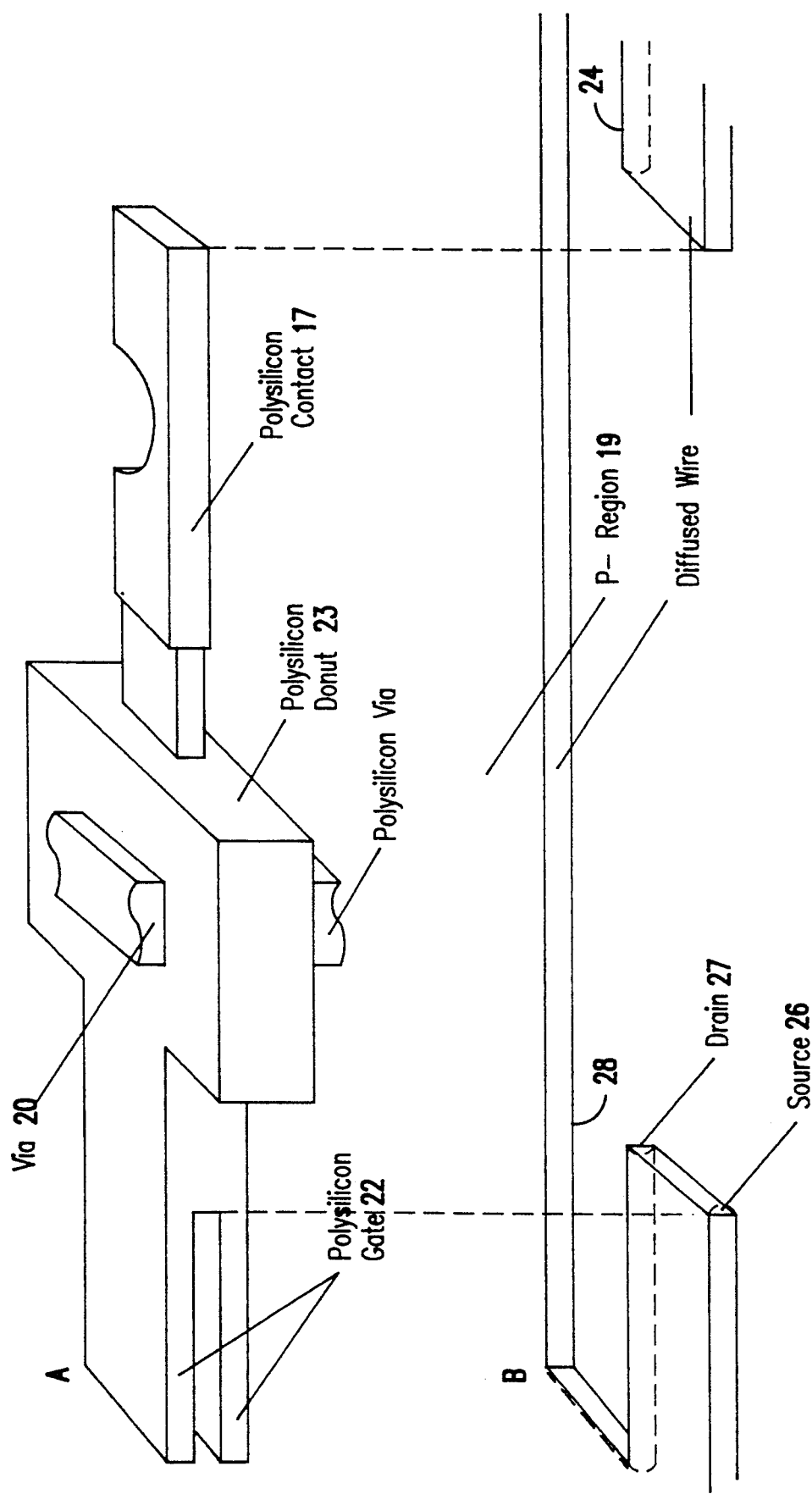
FIG. 2 is an exploded view showing in more detail the structure of the gate connection in the structure of FIG. 1B.

FIG. 2 is an exploded view showing the details of the construction of FET 15 which is typical of the other FETs shown in FIGS. 1A and 1B. FIG. 2 shows the polysilicon gate 22 (which goes above and below the P-channel region), a polysilicon donut 23 around the polysilicon via 20, and a polysilicon contact 17, which makes a contact to a diffused wire 24. If the polysilicon via 20 had not been present, the polysilicon donut 23 would have provided continuity between the polysilicon gate 22 and the polysilicon contact 17. Also shown, but displaced below in this exploded view, is the P−region 19 which fits between the two halves of the gate 22 and which abuts the contact 17. Diffused wire 28, source 26, and drain 27 are also shown. The diffused wire 28 provides contact to the drain 27 of the FET 15. All P−regions and P+ regions are tied to the substrate though a P+ polysilicon via 20, as shown in more detail in FIG. 5.

Figure 3:
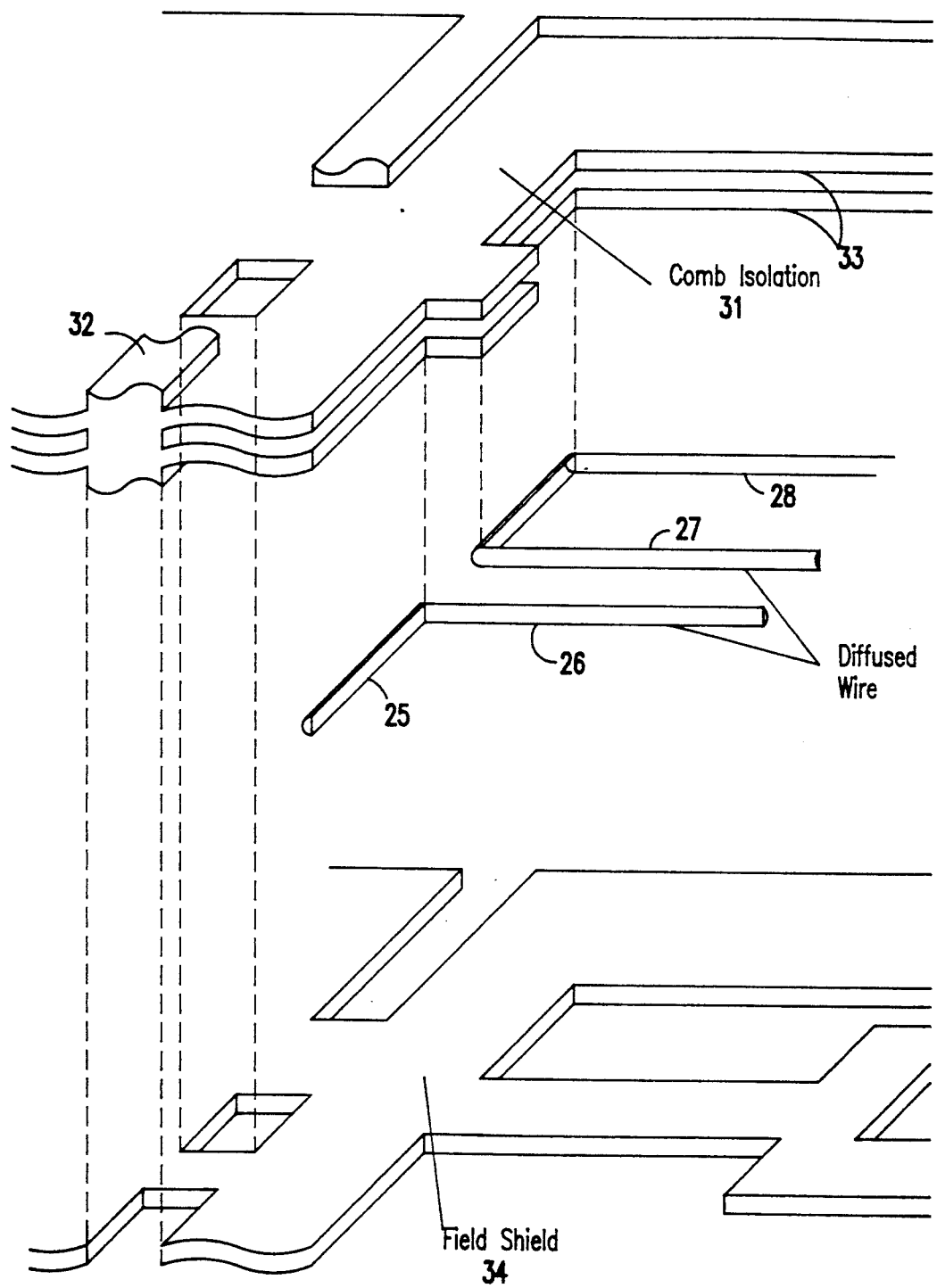
FIG. 3 is an exploded view showing the comb isolation and field shield of the three-dimensional structures.

FIG. 3 is another exploded view of three layers of the circuit. The comb isolation 31 is so named because it has a solid vertical isolation via 32 with horizontal fingers 33 of isolation. The diffused wires 25 and 28 are repeated here from FIG. 2. The field shield 34 is of P+ silicon. In very thin structures, this region may be completely oxidized to form a layer of oxide isolation instead of a field shield.

Figure 4:
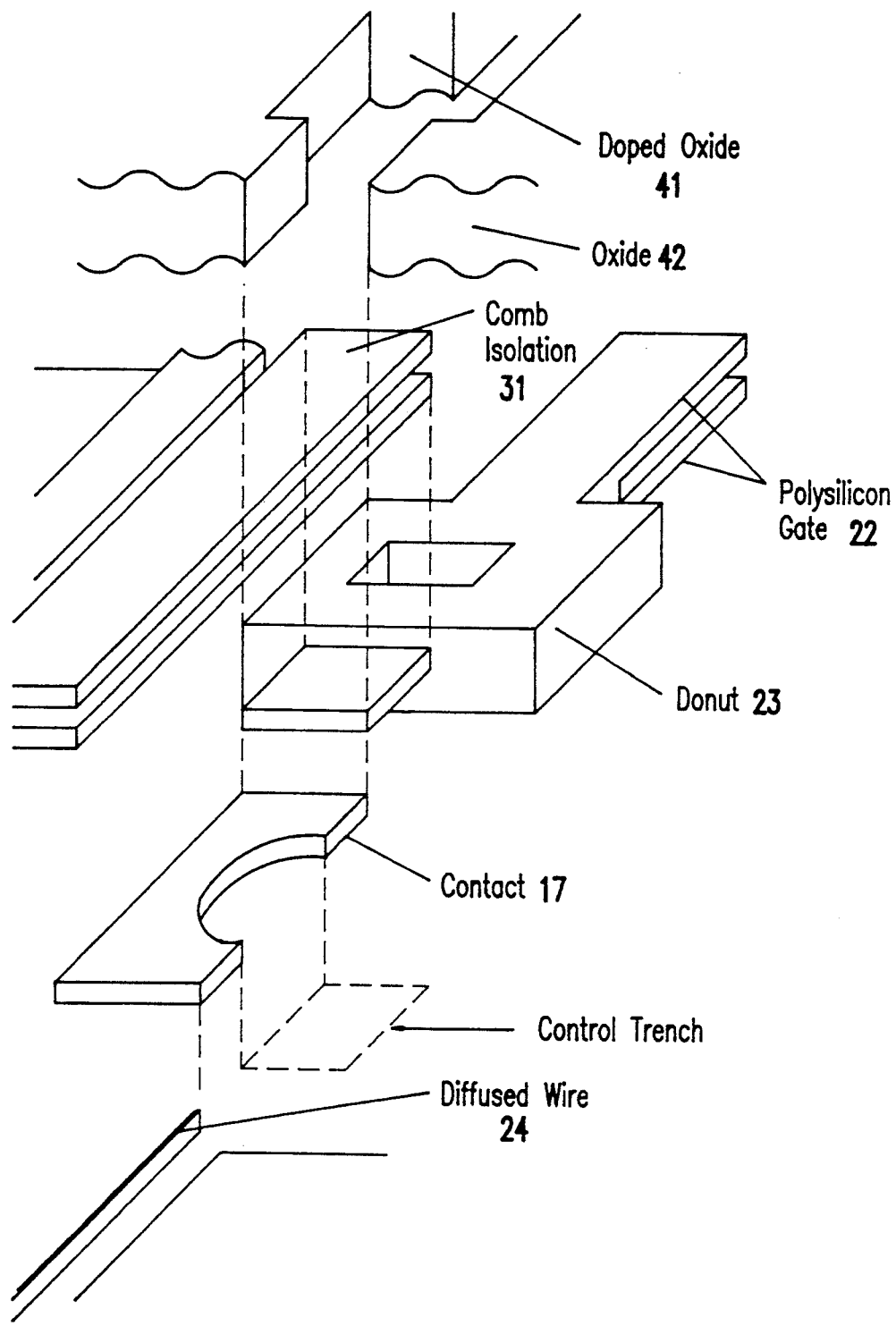
FIG. 4 is an exploded view showing the relationship of the gate connection of FIG. 2 with the comb isolation of FIG. 3.

FIG. 4 is also an exploded view showing details of the polysilicon to diffused wire contact. From top to bottom, there are the vertical trenches 41 and 42 filled with doped and undoped oxide isolation, respectively, the comb isolation 31, polysilicon gate halves 22, the donut 23, a contact 17, and polysilicon wire 24.

Figure 5:
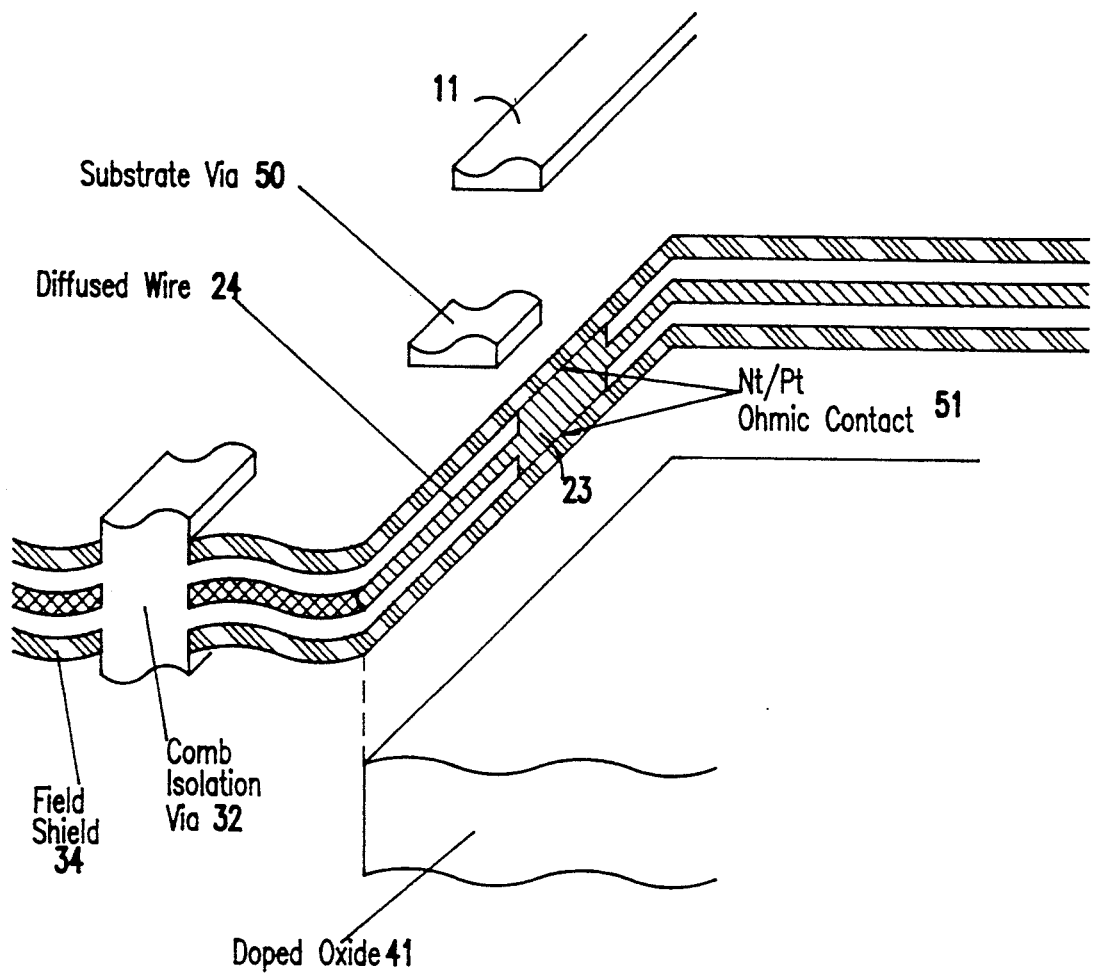
FIG. 5 is an isometric view showing, in two exploded parts, the buried ground contract.

FIG. 5 in two exploded parts illustrates a buried ground contact 51 and the doped oxide 41 which is the source of the dopant atoms within the diffused wire 24.

Figure 6:
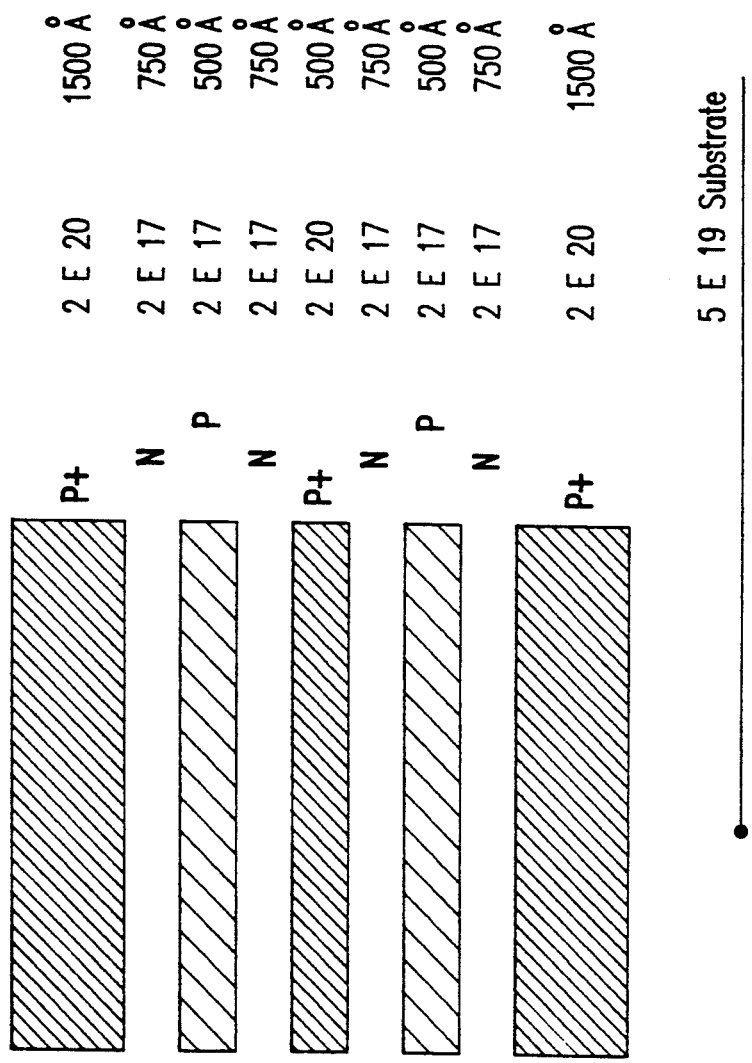
FIG. 6 is a cross-sectional view showing the starting material for a two-layer three-dimensional integrated circuit.

FIG. 6 shows the starting material for two layers of a three-dimensional integrated circuit. This structure comprises epitaxially grown layers in alternating conductivity types, as generally shown. The thicknesses of the layers is shown in the righthand column, while the level of dopant is shown in the lefthand column, where "E" means exponential. The 500 Å and 750 Å dimensions are needed to contain depletion distances under bias. The top 1500 Å dimension is needed to contain processing erosion. The bottom 1500 Å dimension is needed to guarantee that the trench does not penetrate to the substrate.

Before proceeding with a description of the fabrication process, some important points need to be made:

Unlike some previously published three-dimensional integrated circuit structures, these structures are to be made with a single set of masks which simultaneously define the features on every layer of circuits. This distinction becomes very important when many layers of circuits are to be fabricated.

The fabrication procedure relies heavily on low temperature epitaxy to make complex structures of alternating N and P regions with sharp profiles.

The fabrication procedure also relies heavily on the electro-chemical properties of selective etchants. In particular, EGPPW, as presently constituted, has been found to be nearly ideal. EGPPW is a known etchant composed of ethanolamine, gallic acid, water, pyrazine, hydrogen peroxide, and FC-129 (a common wetting agent). This etchant stops on P+ silicon, silicon oxide and silicon nitride. Recently, we have demonstrated that it will also stop on P-silicon if it is properly biased.

In these structures the starting N material exists almost entirely so that it may be selectively etched out by the EGPPW. An exception is the buried ground contact.

The process features trench etching of silicon only. This is an important feature in two regards. The selectivity of silicon trench etching is higher than other materials. Secondly, trenches may be abutted so that the oxide fill of a first trench can be used as a partial mask for a second trench. Large fields of isolation may be fabricated in this manner where a first set of narrow oxide filled trenches on close pitch serve as a mask for an interleaving trench etch and oxide fill.

The trenches in which electro-chemical wet etching is to be done need to be closely registered one to another. This need arises because the fingers created by the wet etches dovetail. In the process described here, all electro-chemical trenches are initiated from a single mask. Subsequent block masks select electro-chemical trenches for further processing.

There can be no high temperature processing done until the last electro-chemical etch is done. This is necessary to insure the fidelity of the low temperature epitaxial profiles which the electro-chemical etchant must be able to follow.

Process for Making the Structure

We begin with a low resistivity substrate 10 doped at approximately $5 \times 10^{19}$. On this substrate at low temperature, there are grown many layers of alternate N and P epitaxy. An example (for only two stacked circuits) is as shown in FIG. 6. Using an oxide mask and reactive ion etching (RIE), a set of deep trenches are etched into the surface. RIE is a form of plasma etching in which ionized gases are directed by an alternating electrical field to selectively etch materials in a direction parallel to the electrical field. In This form of etching is generally referred to as anisotropic etching. In the specific application of RIE to the present invention, some of the etched trenches are wide, while others are narrow. The wide trenches will serve as alignment marks, and the narrow trenches, as oxide isolation.

Figure 7:
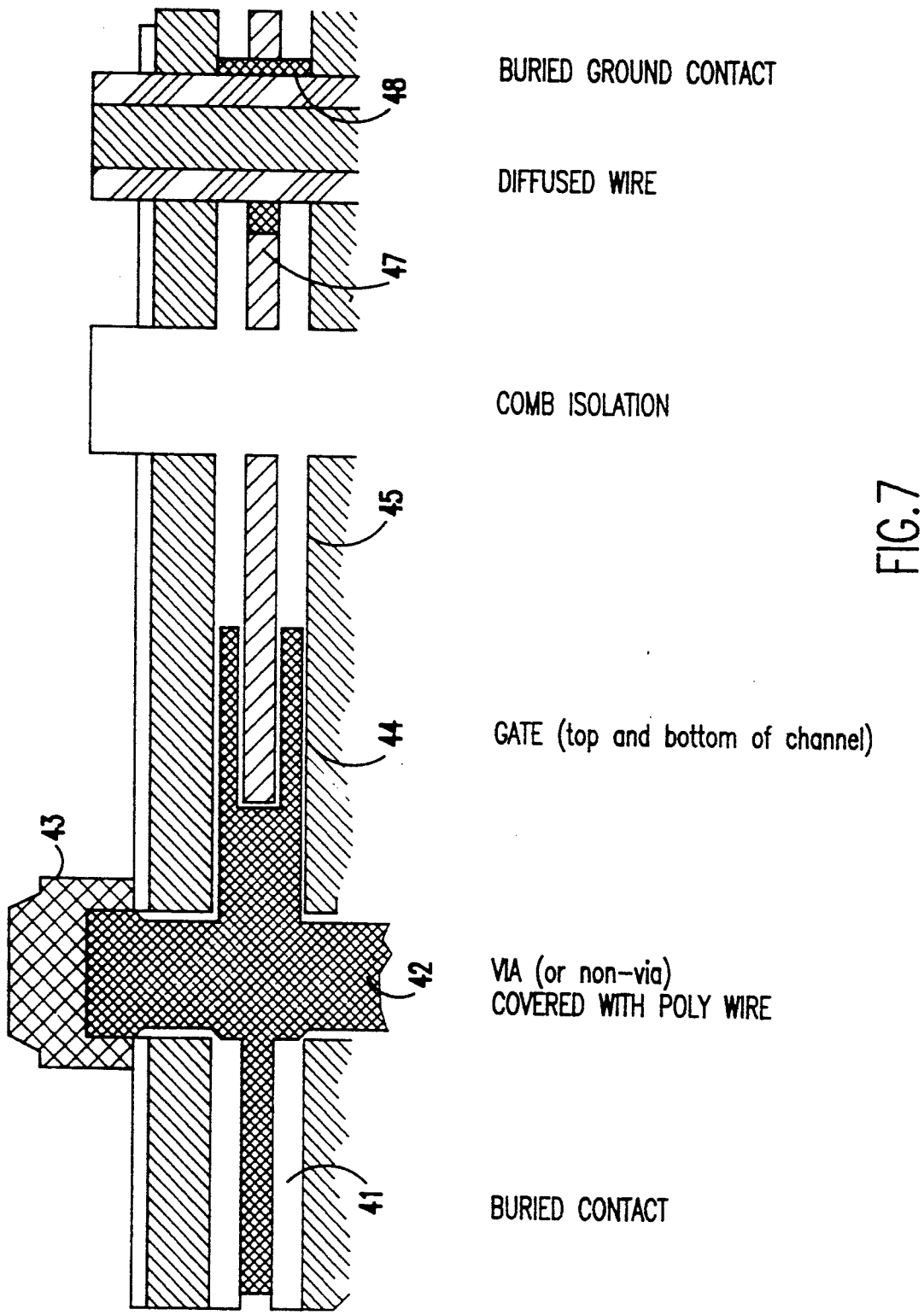
FIG. 7 is a cross-sectional view showing the representative structures which are made according to the invention.

FIG. 7 shows several different structures which are made using the structure shown in FIG. 6. These structures include a buried contact 41, a via 42 (or non-via) covered with a polysilicon wire 43, a gate 44 (top and bottom of channel), comb isolation 45, diffused wire 46, and a buried contact ground 47. The following table provides a summary explanation of how each of these structures is formed.

| 3D INTEGRATED CIRCUIT MASK SEQUENCE | | | |
|---|---|---|---|
| NMOS | CMOS | Contingencies | FUNCTION |
| CT | | | Common Trench |
| OI | | | Oxide Isolation |
| | | (SV) | Substrate Via |
| | XW | | P Channel Diffuse Wire |
| CI | | | Comb Isolation *† |
| | XI | | P Channel Comb Isolation *† |
| G | | | Gate *† |
| V | | | Via † |
| | | (XG) | P Channel Gate *† |
| | | (DW) | Diffused Wire |
| BC | | | Buried Contact † |
| PW | | | Polysilicon Wire |
| 7 | 9 | 12 | |

*Electrochemical Steps
†EGPPW Steps

The 3D Integrated Circuit Process Employs
EGPPW for Electrochemical Etches
P₂O₅ Doped Oxide for Sacrificial Trench Fill
"P-Etch" for Subsequent Trench Reopening. "P-Etch" is a standard formula found in many reference books such as Ghandi, *VLSI Fabrication Principles*, John Wiley (1983).
Nitride for Etch Stop and Planarization
Nitride may need to be removed and replaced more often than shown, depending on wear and RIE or chemical/mechanical (Chem/Mech) state of art etch. Chem/Mech etch is a form of simultaneous mechanical and chemical polishing which etches the wafer back to a planar surface. All trench features except oxide isolation are on the common mask, which is usually the first mask, and are therefore self-aligned one to another. Oxide isolation is self-aligned to the features of the common mask in one dimension.

Common Trench Sequence

Figure 8A:
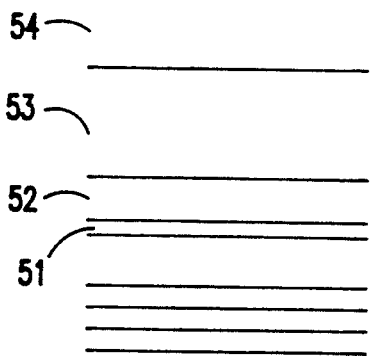
FIGS. 8A to 8D are cross-sectional views showing the common trench sequence which is used in preparation for making the several structures shown in FIG. 7.

The starting semiconductor substrate looks like that depicted in FIG. 6 but may contain more than two layers of alternating N and P regions for forming more than two layers of integrated circuits. Using conventional low temperature deposition techniques, a sequence of materials are deposited on the top surface. As shown in FIG. 8A, the first material is a very thin layer 51 of oxide, followed by a thicker layer 52 of nitride. This is followed by a still thicker layer 53 of intrinsic polysilicon and a final thick layer 54 of TEOS. TEOS is a deposited (not thermally grown) form of silicon oxide. These layers are used as masking material to etch the so called common trench. All electro-chemical etches are initiated from this mask. Subsequent blocking masks will select portions of the features on the common mask for further processing.

Figure 8C:
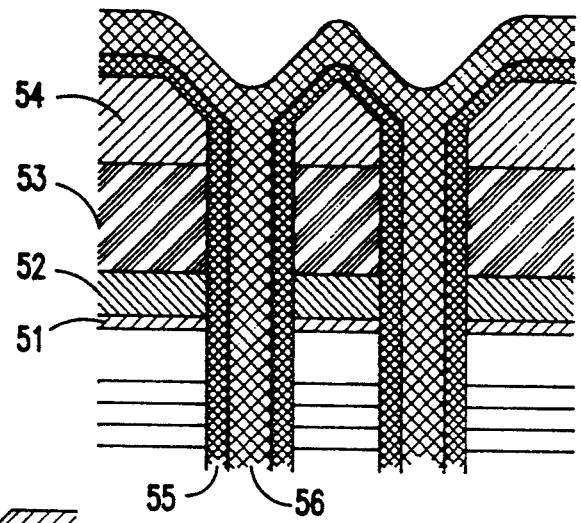
Figure 8B:
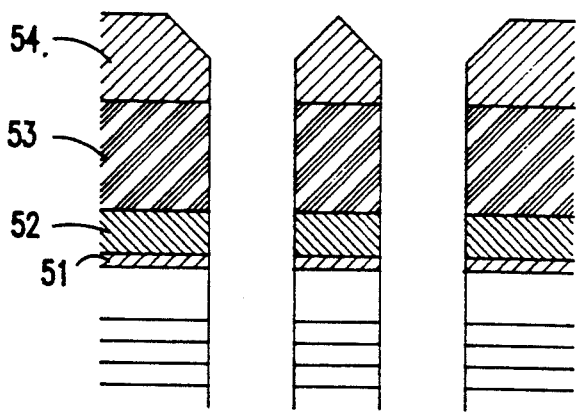

A conventional photoresist is developed on the top of the four layers of deposited material from the photo mask image of the common trench features. The photoresist is used to reactive ion etch (RIE) the top TEOS layer 54. The photoresist is then striped from the wafer in a conventional manner. The TEOS image is then used to RIE the intervening layers 53, 52 and 51 and the trench itself, as shown in FIG. 8B. The etching gases may be changed as the trench penetrates through the various layers.

Figure 8D:
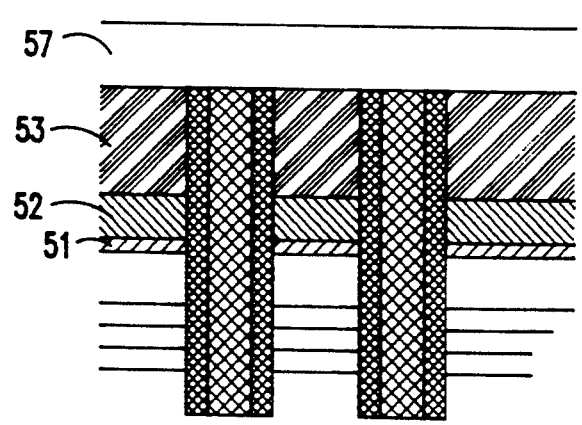

After the RIE, some undesired byproducts of the etch adhere to the sidewalls of the trench. These are removed with a wet etch, usually containing buffered hydrofluoric acid. The etched trenches are then filled with phosphorous doped oxide 55 and 56, as shown in FIG. 8C. The initial layer 55 is relatively lightly doped (about 3.5%), and the final layer 56 more heavily doped (about 14%). Chemical/mechanical etching techniques are used to re-establish a planar surface, using the intrinsic polysilicon layer 53 as an etch stop. Finally, a fresh layer 57 of TEOS is deposited in the conventional manner to produce the structure shown in FIG. 8D.

Briefly summarizing, the process includes the following steps:
Deposit a Thin Oxide
Deposit Nitride
Deposit Intrinsic Silicon (i.e., Polysilicon)
TEOS
Photoresist CT Mask
RIE TEOS
Strip Photoresist
RIE Common Trench
Clean Side Walls
Deposit 3.5% Doped Oxide
Deposit 14% Doped Oxide
Chem/Mech to Polysilicon
TEOS.

Oxide Isolation Sequence

Figure 9A:
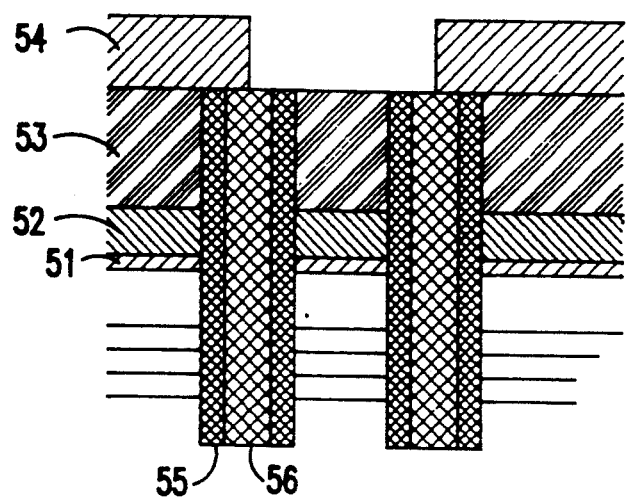
FIGS. 9A to 9C are cross-sectional views showing the oxide isolation sequence.
Figure 9B:
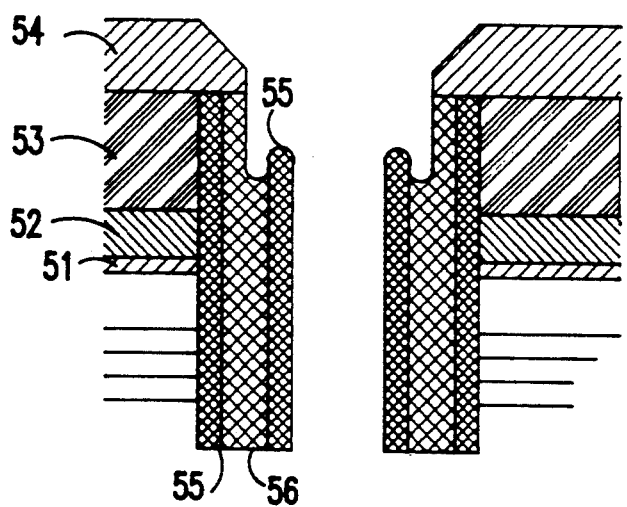
Figure 9C:
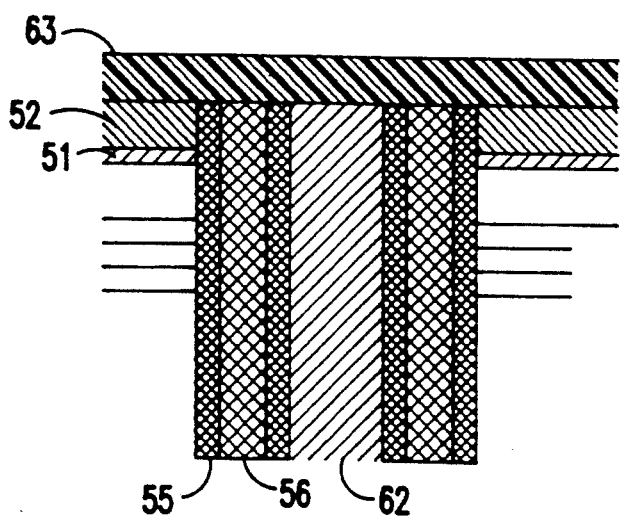

In FIG. 9A, an oxide isolation mask defines a new layer of photoresist which is used as a mask to RIE the TEOS 54. The intrinsic polysilicon layer 53 can be used as an end point detection to stop the RIE. The photoresist is then stripped off. Then in FIG. 9B, TEOS layer image is then used as a mask to RIE the polysilicon layer 53, nitride layer 52 and a new silicon trench. Note that the doped oxide layer 55 serves as a secondary mask defining the new trench in one dimension. After wet etching, the trench is filled with undoped oxide 62 to form an oxide isolation. The wafer is now re-planarized using chemical/mechanical etching techniques. The nitride layer 52 is used as an etch stop. Finally, a new nitride layer 63 is deposited over the freshly replanarized surface to produce the structure shown in FIG. 9C.

Briefly summarizing, the process includes the following steps:
Photoresist OI Mask
RIE TEOS to Polysilicon
Strip Photoresist
RIE Polysilicon, Nitride, Oxide, Silicon Trench
200:1/400:1 Nitric/HF dip
Deposit Oxide
Chem/Mech to Nitride
Deposit Nitride.
The substrate is now ready for all the blocking masks which are used to open portions of the original common trench for further processing.

Comb Isolation Sequence

Figure 10A:
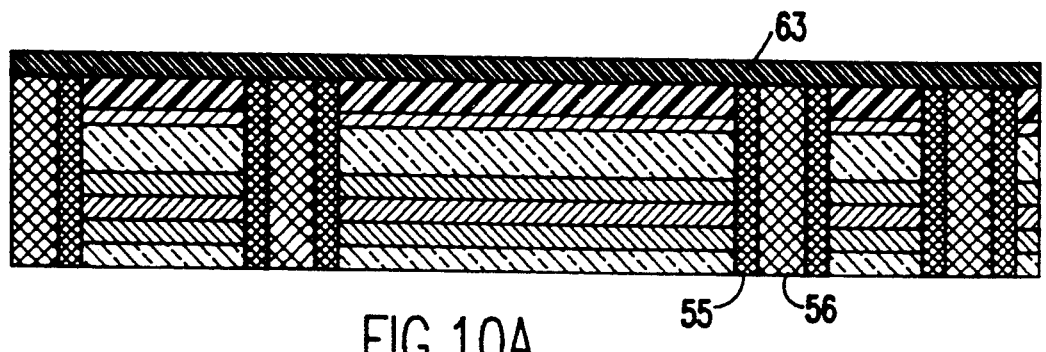
FIGS. 10A to 10D are cross-sectional views showing the comb isolation sequence.
Figure 10B:
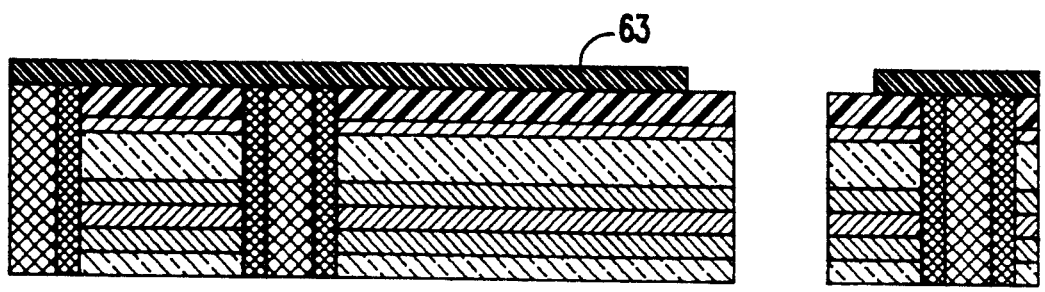
Figure 10C:
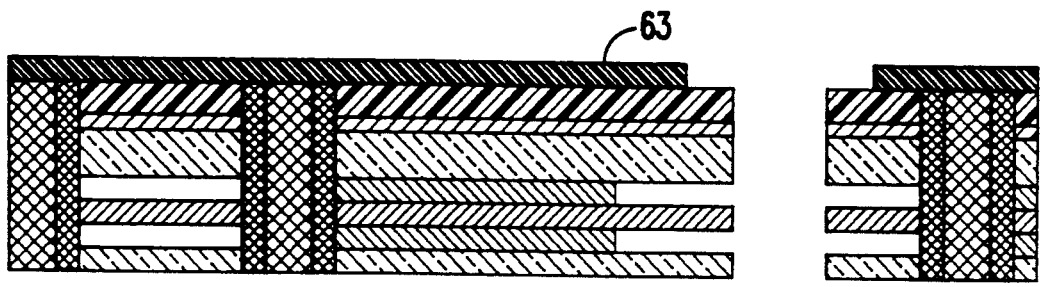
Figure 10D:
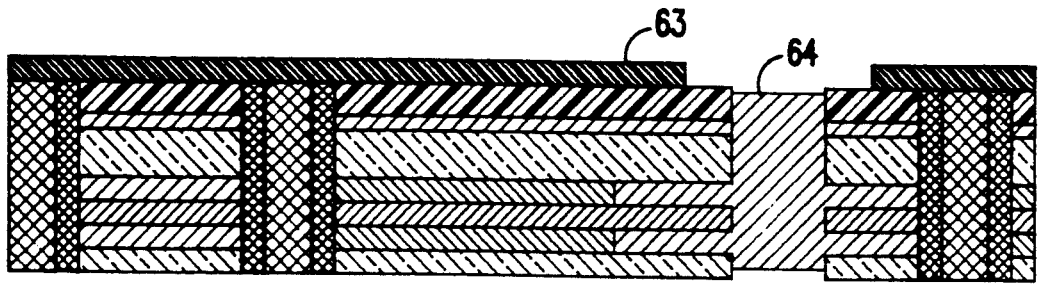

With reference now to FIG. 10A, a comb isolation mask is used to define a fresh layer of photoresist, which in turn is used to RIE the top layer of nitride 63 and expose the doped oxide within selected trenches. A standard wet etch, called "P etch", is used to remove the doped oxide 55, 56 in the selected trenches, as shown in FIG. 10B. With proper electrical bias applied, the wet etch EGPPW is used to remove the finger portion of the comb isolation regions in FIG. 10C. A short etch of high ratio (typically 200:1) nitric/hydrofluoric etches the transition regions between N and P regions. Undoped oxide 64 is deposited to fill the comb isolation regions in FIG. 10D. Finally, excess deposited oxide is removed from the top surface by either RIE, chemical/mechanical or wet etch techniques, as shown in FIG. 10D.

Briefly summarizing, the process includes the following steps:
Photo CI Mask
RIE Nitride
Strip Photoresist
"P Etch"
EGPPW (Electrochemical)
200:1/400:1 Nitric/HF dip etch
Deposit Oxide
RIE or Chem/Mech to Nitride (Wet etch with end point detection may replace some of the RIE or Chem/Mech planarization steps.)

The next few processing steps are very similar. Each time a blocking mask is used to etch some portion of the top nitride surface, each time exposing selected trenches from the original common trench pattern. Each time the doped oxide is etched out by the wet "P etch". Some feature is etched at many layers in the low temperature epitaxy. That feature is then filled with an appropriate material or materials.

Gate Sequence

Figure 11A:
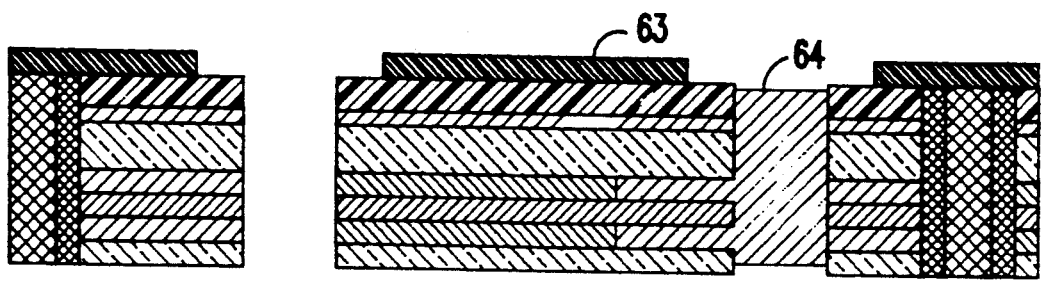
FIGS. 11A to 11D are cross-sectional views showing the gate sequence.
Figure 11B:
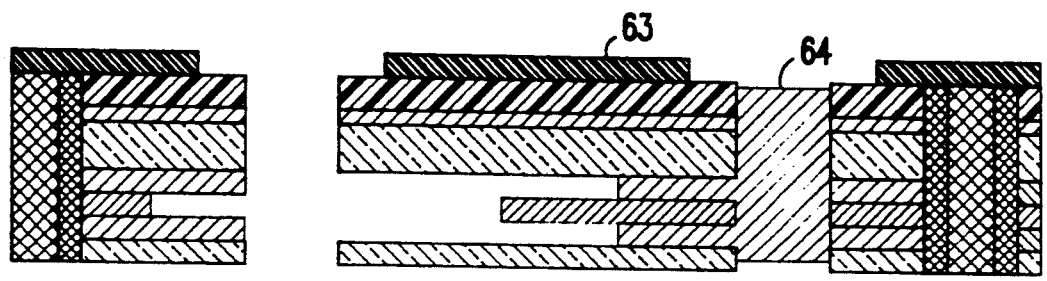
Figure 11C:
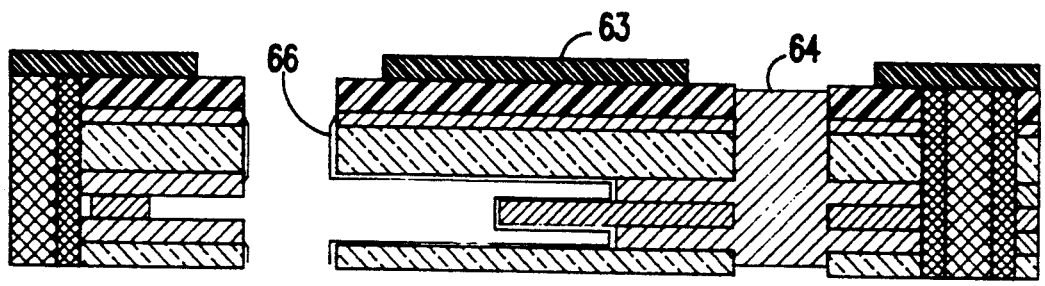
Figure 11D:
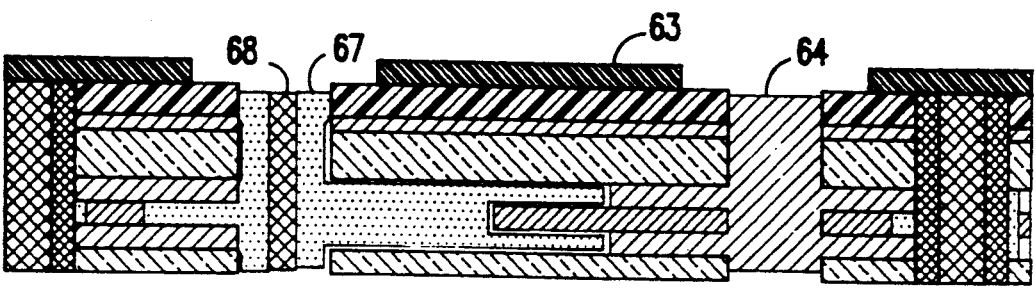

Referring now to FIG. 11A, the gate sequence is next. The photoresist, RIE nitride, strip photoresist, "P etch" doped oxide removal sequence is done first. EGPPW is first used without an electrical bias, etching both N and P regions but not the P+ regions to form the donut in FIG. 11B. Then an electrical bias is applied, and the gate regions are etched out of the N regions. Etching stops when the EGPPW reaches the comb isolation, the oxide being the etch stop. A thermal oxide 66 is grown to form the gate oxide in FIG. 11C. The doped polysilicon gate material 67 is deposited. The center core is filled with doped oxide 68 and planarized again by RIE, chemical/mechanical or wet etch techniques in FIG. 11D. This first high temperature step also forms the diffused wire from dopants out-diffusing from the remaining phosphorous doped oxide filled trenches.

Briefly summarizing, the process includes the following steps:
Photoresist G Mask
RIE Nitride
Strip Photoresist
"P Etch"
EGPPW (Electrochemical)
200:1/400:1 Nitric/HF dip etch
Grow Thermal Oxide (first thermal cycle)
Deposit Doped Polysilicon
Deposit Doped Oxide
RIE or Chem/Mech to Nitride.

Via Sequence

Figure 12A:
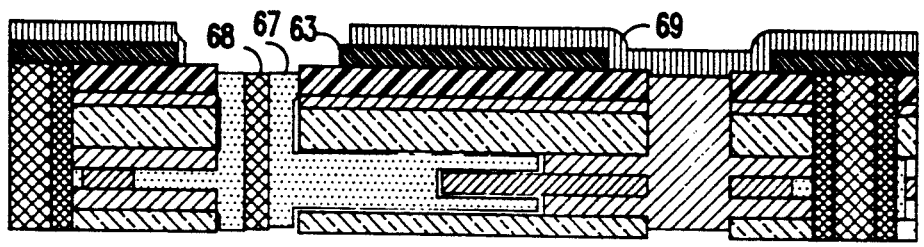
FIGS. 12A to 12F are cross-sectional views showing the via sequence.
Figure 12B:
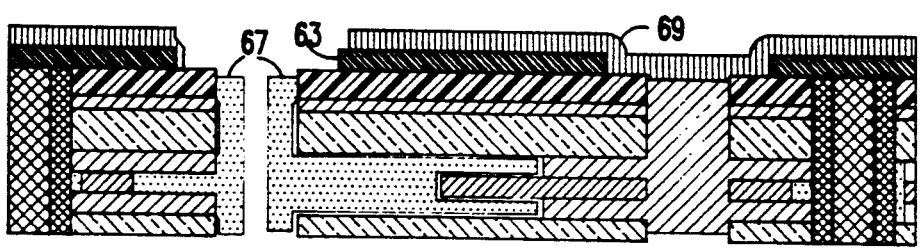
Figure 12C:
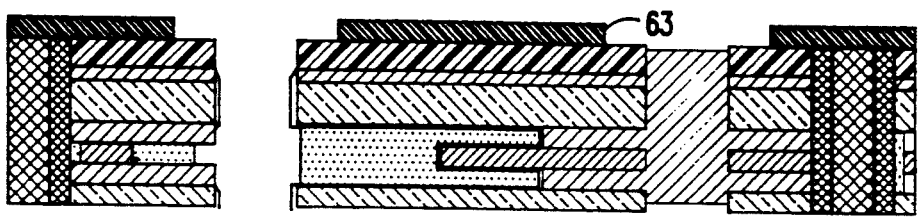
Figure 12D:
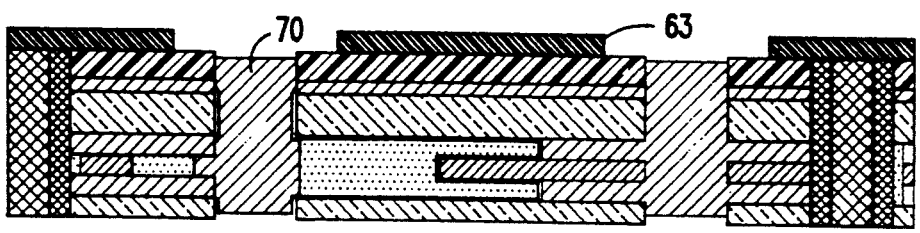
Figure 12E:
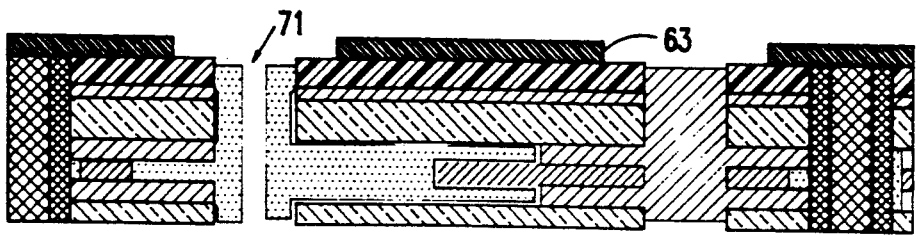
Figure 12F:
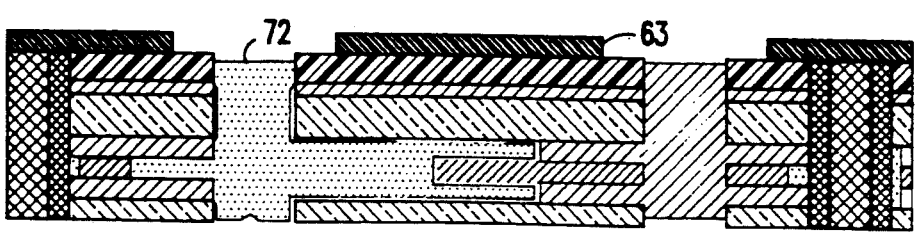

We now need to distinguish between polysilicon gates that are connected by a polysilicon via and those that are independent on every level. A polysilicon layer 69 is deposited. No trenches are exposed so it does not go into any. A photoresist region is developed by the via mask and used to RIE the polysilicon layer 69 over trenches which will not have electrical vias in FIG. 12A. The photoresist is stripped, and, in FIG. 12B, once again "P etch" is used to remove the doped oxide 68 in the exposed trenches. A timed polysilicon etch is used to remove the polysilicon 67 in the core but not the donut nor the gates in FIG. 12C. The aspect ratio of donut and core is a considerable advantage in this timed etch. Notice that the polysilicon layer 69 deposited at the beginning of this series of steps is also removed at the same time. Undoped oxide 70 is deposited filling the exposed trenches in FIG. 12D. The structure is replanarized again by RIE, chemical/mechanical or wet etch techniques. The nitride layer 63 forms a convenient etch stop. The doped oxide core in the via trenches previously protected by the via mask and the deposited polysilicon layer are now exposed. These are etched out by the "P wet etch" in FIG. 12E. The hollow core 71 is then filled in FIG. 12F by a deposited doped polysilicon 72, and the structure is once more planarized by RIE, chemical/mechanical or wet etch techniques.

Briefly summarizing, the process includes the following steps:
Deposit Polysilicon
Photoresist V Mask
RIE Polysilicon
Strip Photoresist
"P Etch"
Polysilicon Etch
Deposit Oxide
RIE or Chem/Mech to Nitride
"P Etch"
Deposit Polysilicon
RIE or Chem/Mech to Nitride.

Buried Contact Sequence

Figure 13A:
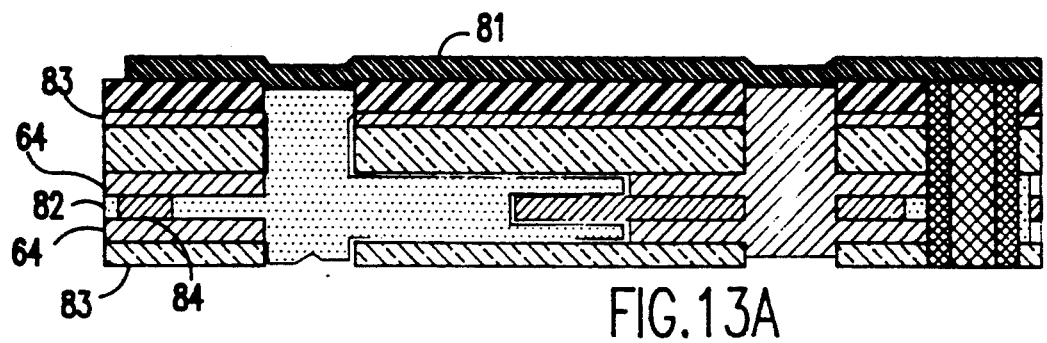
FIGS. 13A to 13C are cross-sectional views showing the buried contact sequence.
Figure 13B:
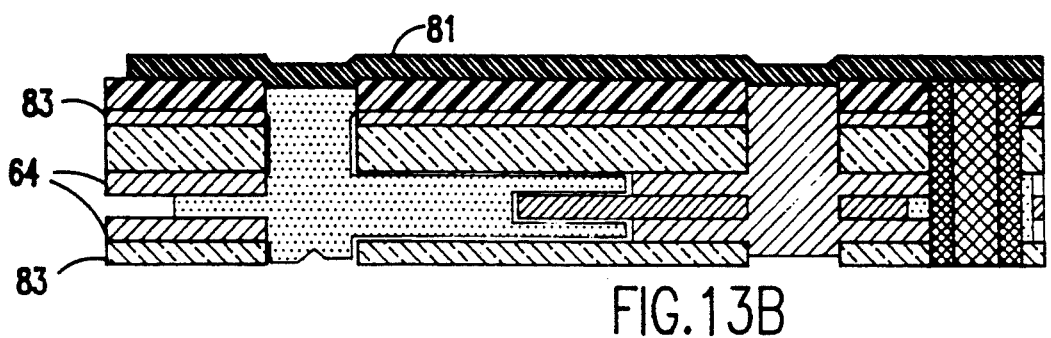
Figure 13C:
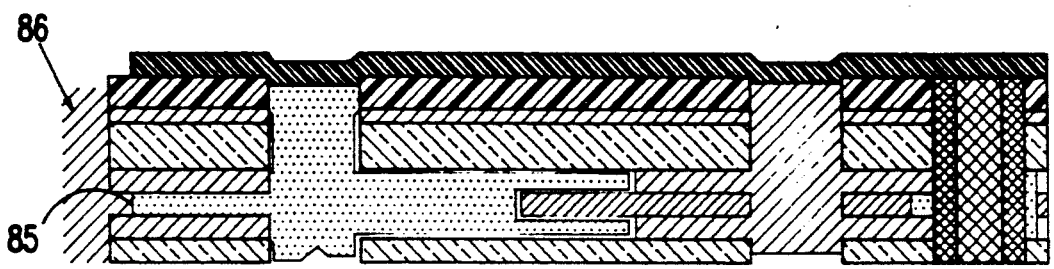

The buried contact sequence begins in FIG. 13A by first wet etching away the entire top nitride layer. A fresh nitride layer 81 is deposited. The buried contact mask personalizes a new photoresist level which in turn is used to RIE the fresh nitride layer where buried contacts are intended. The photoresist is once again stripped. "P etch" is again used to remove the doped oxide core. EGPPW with no electrical bias applied or a nitride/hydrofluoric silicon etch can be used to remove the P doped regions 82 trapped between the comb oxide 64. Neither etch will attack the P+ field shield 83. A very brief oxide etch removes the oxide barrier 84 to the donut, as shown in FIG. 13B. Doped polysilicon 85 is deposited to fill the core then wet etched to leave only the contact shown in FIG. 13C. This is the contact 17 shown in FIG. 4. Finally, the trench is filled with deposited oxide 86. The structure is replanarized by RIE, chemical/mechanical or wet etch techniques. Again, the nitride layer 81 is a convenient end point. All nitride is next removed by hot phosphoric acid exposing the polysilicon vias.

Briefly summarizing, the process includes the following steps:
Wet Etch Top Nitride
Deposit Fresh Nitride Photoresist BC Mask
RIE Nitride
Strip Photoresist
"P Etch"
EGPPW or Nitric/HF Silicon Etch
Oxide Etch: BHF or "P Etch"
Deposit Doped Polysilicon
Wet Etch Polysilicon
Deposit Oxide
RIE or Chem/Mech to Nitride
Wet Etch all Nitride (Hot $H_3PO_4$), Poly Wire Sequence (or Poly Landing Pad)

Figure 14:
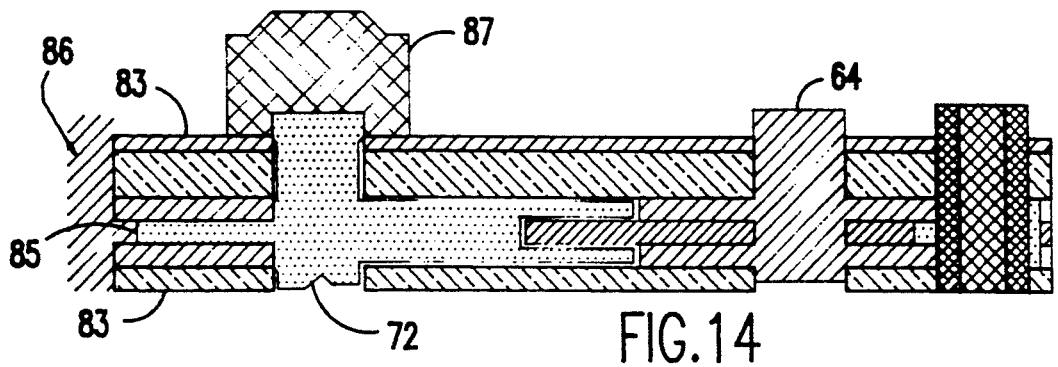
FIG. 14 is a cross-sectional view showing the formation of a poly wire or poly landing pad.

Referring now to FIG. 14, polysilicon contact pads and polysilicon wiring at the surface may now be accomplished by conventional processing. For example, a layer 87 of polysilicon is first deposited. The polysilicon is doped by ion implantation and possibly silicided. A photomask and photoresist define the wire regions. The doped polysilicon is RIE etched, using oxide as an end point detection. Subsequent layers of wire are fabricated by conventional integrated circuit methods.

Briefly summarizing, the process includes the following steps:
Deposit Polysilicon
II or Silicide
Photoresist PW Mask
RIE Polysilicon Stop on Oxide—Polysilicon Probe
Deposit Oxide.

While the invention has been described in terms of an exemplary structure and process, those skilled in the art will recognize that the invention can be practiced with modification within the spirit and scope of the appended claims. Various materials can be substituted for those described, provided the new materials have the same properties as those described. Other specific forms of achieving anisotropic etching may also be employed.

Having thus described our invention, what we claim as new and desire to secure by Letters Patent is as follows:

1. A semiconductor structure comprising:
   a substantially planar substrate; and
   a plurality of epitaxially grown layers of alternating conductivity types on said planar substrate, said layers forming at least two groups of three layers of alternating conductivity types separated by an intermediate layer, each of said groups of layers defining different levels in a perpendicular dimension to said planar substrate in which semiconductor devices may be formed, each said intermediate layer having a substantially higher conductivity than said groups of layers,
   wherein a plurality of oxide filled trenches extend from a first surface of said structure intersecting said at least two groups of three layers of alternating conductivity types, at least some of said layers being etched back substantially perpendicular to said plurality of oxide filled trenches to form etched back volumes, said etched back volumes being filled with oxide.

2. The semiconductor structure recited in claim 1 wherein each of said groups of layers comprises a first planar region of a first material and a plurality of second planar regions of a second material interleaved with said first planar region, and
   wherein said plurality of oxide filled trenches extend from said first surface of said structure intersecting said first and second planar regions, said at least some of said layers comprising at least some of said plurality of second planar regions of said second material being etched back and other etched back volumes filled with oxide, said etched back and filled second planar regions defining gate structures,
   said semiconductor structure further comprising conductive diffused wiring on opposite edges of at least some of said plurality of first planar regions of said first material disposed between said gate structures,
   said first planar regions of said first material between said opposite edges defining a channel having a source at one edge and a drain at an opposite edge, and at least one coupling region passing substantially orthogonally through at least some of the planes of said first and second regions, said coupling region including at least one conductor.

3. The semiconductor structure recited in claim 1 further comprising: first, second and third etch masking layers over said epitaxially grown layers, each of said etch masking layers being selectively removable with respect to its immediately adjacent neighbor.

4. The semiconductor structure recited in claim 1 further comprising:
   a oxide layer over an uppermost one of said epitaxially grown layers;
   a nitride layer over said oxide layer;
   a silicon layer over said nitride layer; and
   a second oxide layer over said silicon layer.

5. The semiconductor structure recited in claim 4 wherein a plurality of trenches orthogonal to said planar surface of said substrate are formed in said epitaxial layers using a common mask formed in said second oxide layer, said epitaxial layers being selectively etched and filled to form semiconductor devices in each of said groups of layers, and said trenches being filled with an oxide.

6. The semiconductor structure recited in claim 4 wherein a plurality of trenches orthogonal to said planar surface of said substrate are formed in said epitaxial layers using a common mask formed in said second oxide layer, said epitaxial layers being selectively etched and filled to form semiconductor devices in each of said groups of layers, and said trenches being filled with a doped polysilicon.

7. The semiconductor structure recited in claim 5 wherein a thermal oxide is grown on exposed surfaces within said trenches before being filled.

* * * * *